United States Patent
Chen et al.

(10) Patent No.: US 9,247,642 B2
(45) Date of Patent: Jan. 26, 2016

(54) PIN CONNECTOR STRUCTURE AND METHOD

(75) Inventors: Tsung-Yu Chen, Tapei (TW); Rebecca Shia, Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/533,681

(22) Filed: Jun. 26, 2012

(65) Prior Publication Data

US 2013/0342986 A1 Dec. 26, 2013

(51) Int. Cl.
| | | |
|---|---|---|
| *H01L 23/488* | (2006.01) | |
| *H05K 1/11* | (2006.01) | |
| *H01L 23/48* | (2006.01) | |
| *H05K 3/10* | (2006.01) | |
| *H01L 23/498* | (2006.01) | |
| *H05K 3/40* | (2006.01) | |
| *H05K 3/34* | (2006.01) | |

(52) U.S. Cl.
CPC ................ *H05K 1/11* (2013.01); *H01L 23/481* (2013.01); *H01L 23/49811* (2013.01); *H05K 3/103* (2013.01); *H05K 3/4015* (2013.01); *H01L 2224/131* (2013.01); *H01L 2224/16225* (2013.01); *H01L 2224/16227* (2013.01); *H01L 2224/32245* (2013.01); *H01L 2224/73204* (2013.01); *H01L 2224/73253* (2013.01); *H01L 2924/15311* (2013.01); *H05K 3/3426* (2013.01); *H05K 2201/1081* (2013.01); *H05K 2201/10318* (2013.01); *H05K 2201/10787* (2013.01); *H05K 2201/10795* (2013.01); *H05K 2203/1178* (2013.01)

(58) Field of Classification Search
CPC .......... H05K 2201/10318; H05K 2201/10704; H01L 23/49; H01L 23/49811; H01L 2924/15312; H01L 2924/15322; H01L 2924/15332
See application file for complete search history.

(56) References Cited

U.S. PATENT DOCUMENTS

| | | | |
|---|---|---|---|
| 6,623,283 B1 * | 9/2003 | Torigian et al. ................. | 439/83 |
| 2008/0303135 A1 * | 12/2008 | Pang ............................. | 257/697 |
| 2013/0017740 A1 * | 1/2013 | Yeh et al. ...................... | 439/884 |

* cited by examiner

*Primary Examiner* — Robert Bachner
*Assistant Examiner* — Molly Reida
(74) *Attorney, Agent, or Firm* — Schwegman Lundberg & Woessner, P.A.

(57) ABSTRACT

Embodiments pin connections, electronic devices, and methods are shown that include pin configurations to reduce voids and pin tilting and other concerns during pin attach operations, such as attachment to a chip package pin grid array. Pin head are shown that include features such as convex surfaces, a number of legs, and channels in pin head surfaces.

8 Claims, 4 Drawing Sheets

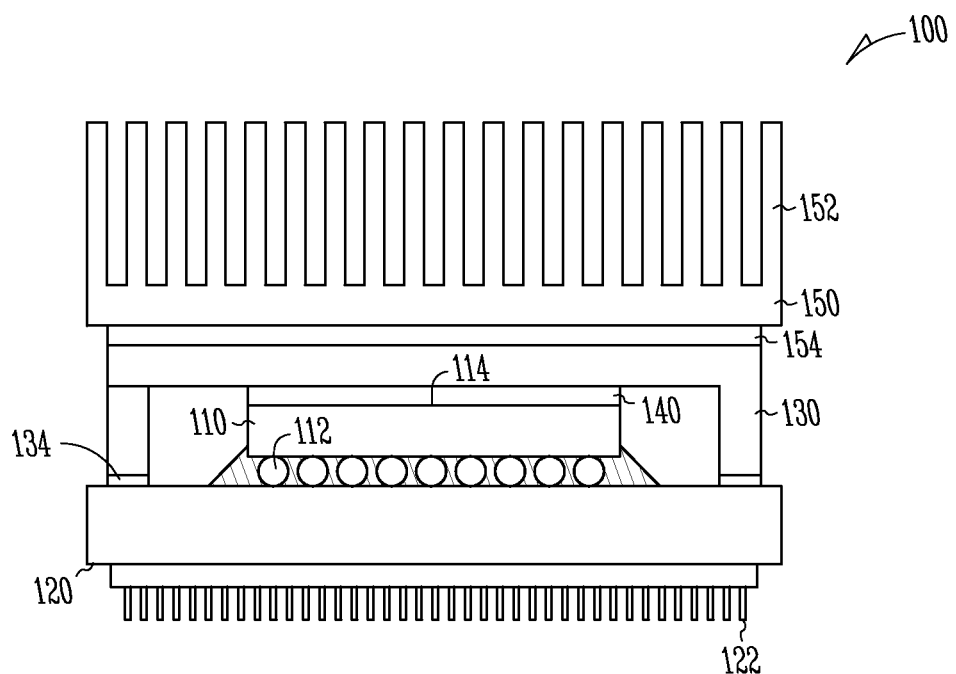
*Fig. 1*
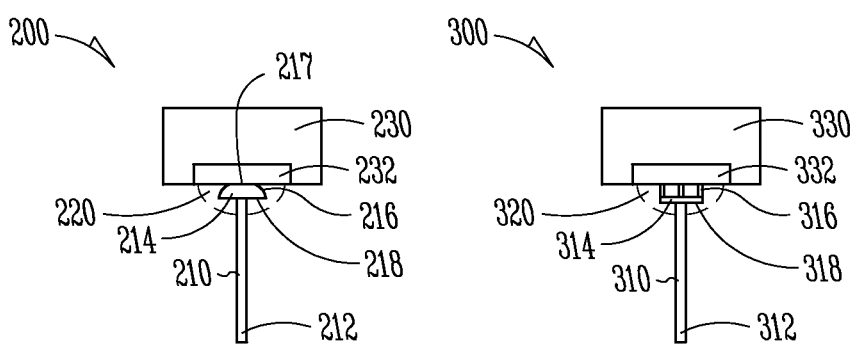
*Fig. 2*  *Fig. 3*

PIN CONNECTOR STRUCTURE AND METHOD

TECHNICAL FIELD

Embodiments pertain to integrated circuit (IC) dies and die packages, and associated methods.

BACKGROUND

Semiconductor dies are often coupled to other circuitry in an electronic system through a substrate. The substrate includes interconnection circuitry that routes power and data between other electrical components and the semiconductor die that is coupled to the substrate.

In pin connection structures, such as pin grid arrays, improved mechanical integrity and conductivity are desired. Voids in a joining matrix material can be detrimental in a number of ways, including reducing mechanical integrity and/or causing tilting of pins. It is desired to improve pin stability and to reduce voids in a matrix material joining pins to a substrate.

BRIEF DESCRIPTION OF THE DRAWINGS

FIG. 1 is a cross section view of an IC package in accordance with some embodiments;

FIG. 2 is cross section view of a pin connection in accordance with some embodiments;

FIG. 3 is cross section view of another pin connection in accordance with some embodiments;

DETAILED DESCRIPTION

Figure 4:
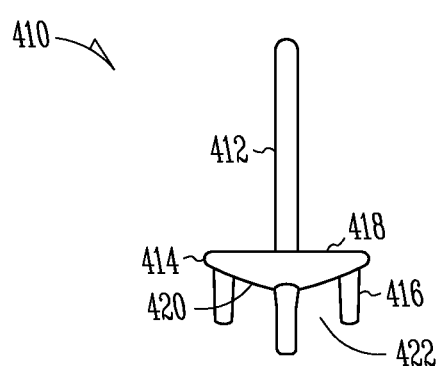
FIG. 4 is an isometric view of a pin in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

FIG. 1 shows a cross-sectional representation of an IC package 100. In embodiments where the IC die is a processor die, the IC package can be termed a processor assembly. IC package 100 includes an IC die 110 mounted in "flip-chip" orientation with its active side facing downward to couple with an upper surface of a substrate 120, through interconnections 112 such as solder balls or bumps. The substrate 120 also shows pins 122 on its opposite surface to form a pin grid array (PGA) for mating with additional packaging structure (not shown).

Die 110 generates its heat from internal structure, including wiring traces, located near its active side; however, a significant portion of the heat is dissipated through its back side 114. Heat that is concentrated within the die is dissipated to a large surface that is in contact with the die in the form of an integrated heat spreader 130. A thermal interface material 140 is often provided between the die 110 and integrated heat spreader 130. In one embodiment, to further dissipate heat from the integrated heat spreader 130, a heat sink 150 optionally having fins 152 is coupled to the integrated heat spreader 130.

FIG. 2 shows one example of a pin connection 200. The pin connection 200 includes a portion of a substrate 230 similar to substrate 120 from FIG. 1. An electrical connection 232 is shown on the substrate 230. A pin 210, including a pin point 212 and a pin head 214, is shown coupled to the electrical connection 232 by embedding the pin head 214 in a matrix material 220. In one example, the matrix material 220 includes solder. Other examples of matrix materials may include metals or polymers. In one example, the matrix material includes a tin-antimony solder, although other solder compositions are also within the scope of embodiments of the invention.

During fabrication of a pin connection, gas bubbles may be generated at during application of the matrix material 220. Gas bubbles can cause detrimental effects, such as voids in the resulting matrix material, and/or tilting of the pin 210. It is desired to provide a pin connection 200 with good alignment, and few or no voids to increase conductivity, and to provide good mechanical integrity to hold the pin in place during attachment or removal from a corresponding socket.

The pin 210 shown in FIG. 2, includes a pin head 214 having a bottom surface 218, and a substantially convex top surface 216. A portion of the substantially convex top surface 216 forms an interface 217 with the electrical connection 232 such that the pin head 214 will stand up during application of the matrix material 220.

In one example, the substantially convex top surface 216 channels any gas bubbles away from between the electrical connection 232 and the pin head 214. In examples where the pin head is down, and the pin point is up during application of the matrix material 220, the gas bubbles will float upwards along the convex top surface 216, and not become trapped at the interface between the electrical connection 232 and the pin head 214. Trapped gas bubbles may cause pin tilting or voids within the matrix material.

FIG. 3 shows another example of a pin connection 300. The pin connection 300 includes a portion of a substrate 330 similar to substrate 120 from FIG. 1, and substrate 230 from FIG. 2. An electrical connection 332 is shown on the substrate 330. A pin 310, including a pin point 312 and a pin head 314, is shown coupled to the electrical connection 332 by embedding the pin head 314 in a matrix material 220 such as solder.

The pin 310 shown in FIG. 3, includes a pin head 314 having a bottom surface 318, and number of legs 316 extending at least partially away from the pin head 314 in a direction away from the point 312 of the pin 310. In one example, the pin head 314 includes three or more legs 316 that stabilize the pin 310 such that the pin head 314 will stand up during application of the matrix material 320. In examples using only three legs, the three legs form a stable plane, with no potential for one leg being slightly too short or too long. Although three legs are shown in FIG. 3, other numbers of legs 316 are also within the scope of the invention.

In one example, the legs 316 provide a space between the legs 316, and beneath the pin head 314 that channels any gas bubbles away from between the electrical connection 332 and the pin head 314.

FIG. 4 shows an example of a pin 410 for use in a pin connection such as a pin grid array. The pin 410 includes a pin head 414 having a bottom surface 418, and number of legs 416 extending at least partially away from the pin head 414 in a direction away from a point 412 of the pin 410. In the example of FIG. 4, the legs 416 extend in a direction that is substantially directly opposite the point 412 of the pin 410. Other examples may include legs 416 that extend at an angle away from the pin 410, with a component of the leg direction extending away from the pin head in a direction away from a point of the pin. In such a configuration, the leg 416 is extending only partially away from the pin head in a direction away from a point of the pin.

A space 422 is provided between the legs 416 and beneath the pin head 414 that will channel any gas bubbles away during an attachment operation using a matrix material such as solder.

The pin head 414 of FIG. 4 further includes at least a portion of a flat bottom surface 418. Flat portions such as bottom surface 418 may provide increased mechanical stability, making the pin more resistant to pulling out of the matrix material when inserting or removing the pin 410 from a corresponding socket.

Figure 5:
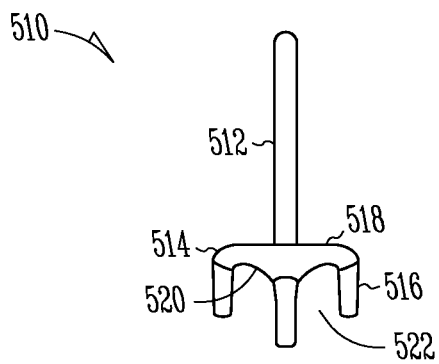
FIG. 5 is an isometric view of a pin in accordance with some embodiments.

FIG. 5 shows an example of a pin 510 for use in a pin connection such as a pin grid array. The pin 510 includes a pin head 514 having a bottom surface 518, and a number of legs 516 extending at least partially away from the pin head 514 in a direction away from a point 512 of the pin 510. A space 522 is provided between the legs 516 and beneath the pin head 514 that will channel any gas bubbles away during an attachment operation using a matrix material such as solder.

Figure 6:
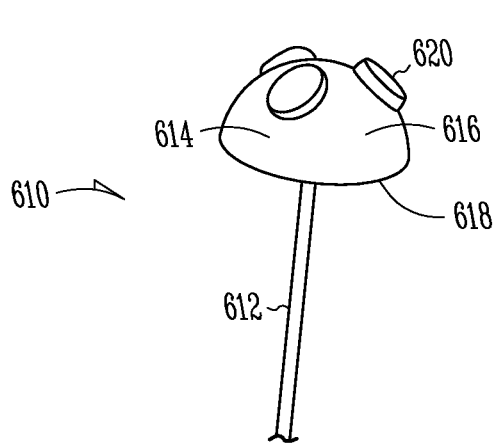
FIG. 6 is an isometric view of a pin in accordance with some embodiments.

FIG. 6 shows an example of a pin 610 for use in a pin connection such as a pin grid array. The pin 610 includes a pin head 614 having a bottom surface 618, and a substantially convex top surface 616. The example of FIG. 6 further includes a number of legs 620 extending at least partially away from the pin head 614 in a direction away from a point 612 of the pin 510.

The example of FIG. 6 includes three legs 620 that stabilize the pin 610 such that the pin head 614 will stand up during application of matrix material. The substantially convex top surface 616 channels any gas bubbles away from between an electrical connection and the pin head 614. In addition to the convex surface, the example of FIG. 6 also provides a space between the legs 616 to channel any gas bubbles away during an attachment operation using a matrix material such as solder.

Figure 7:
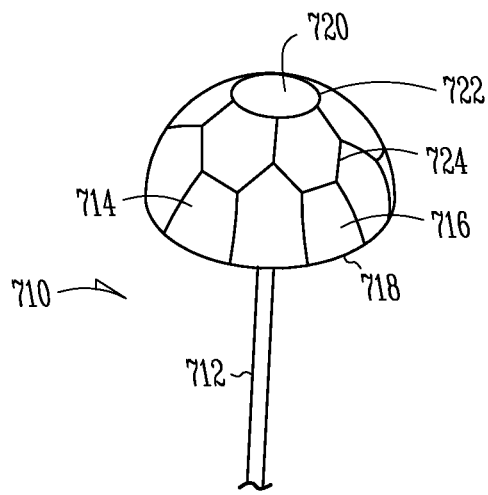
FIG. 7 is an isometric view of a pin in accordance with some embodiments.

FIG. 7 shows an example of a pin 710 for use in a pin connection such as a pin grid array. The pin 710 includes a pin head 714 having a bottom surface 718, and a substantially convex top surface 716. The example of FIG. 7 includes a cavity 720 that defines a rim 722. In one example, the rim 722 provides stability to keep the pin head 714 standing during an attachment operation using a matrix material such as solder.

The pin head 714 of FIG. 7 also illustrates a pattern 724 formed on the substantially convex top surface 716. In one example, the pattern 724 includes one or more channels that aid in removal of any gas bubbles away during an attachment operation using a matrix material such as solder.

Figure 8:
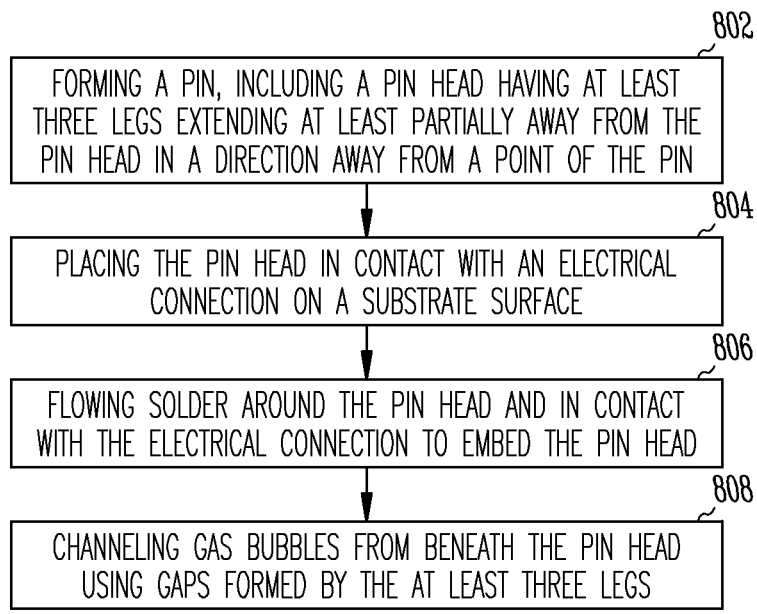
FIG. 8 is a flow diagram of a method in accordance with some embodiments.

FIG. 8 shows one example of a method of forming a pin connection. In operation 802, a pin is formed, including a pin head having at least three legs extending at least partially away from the pin head in a direction away from a point of the pin. In operation 804, the pin head is placed in contact with an electrical connection on a substrate surface. In operation 806, solder is flowed around the pin head and in contact with the electrical connection to embed the pin head. In operation 808, gas bubbles are channeled from beneath the pin head using gaps formed by the at least three legs.

In some example methods, a substantially convex top surface is also formed on the pin head. In some example methods, one or more grooves are further formed in the substantially convex top surface. Structures such as channels may be formed by casting, forging, etching, etc. into the substantially convex top surface 716.

Figure 9:
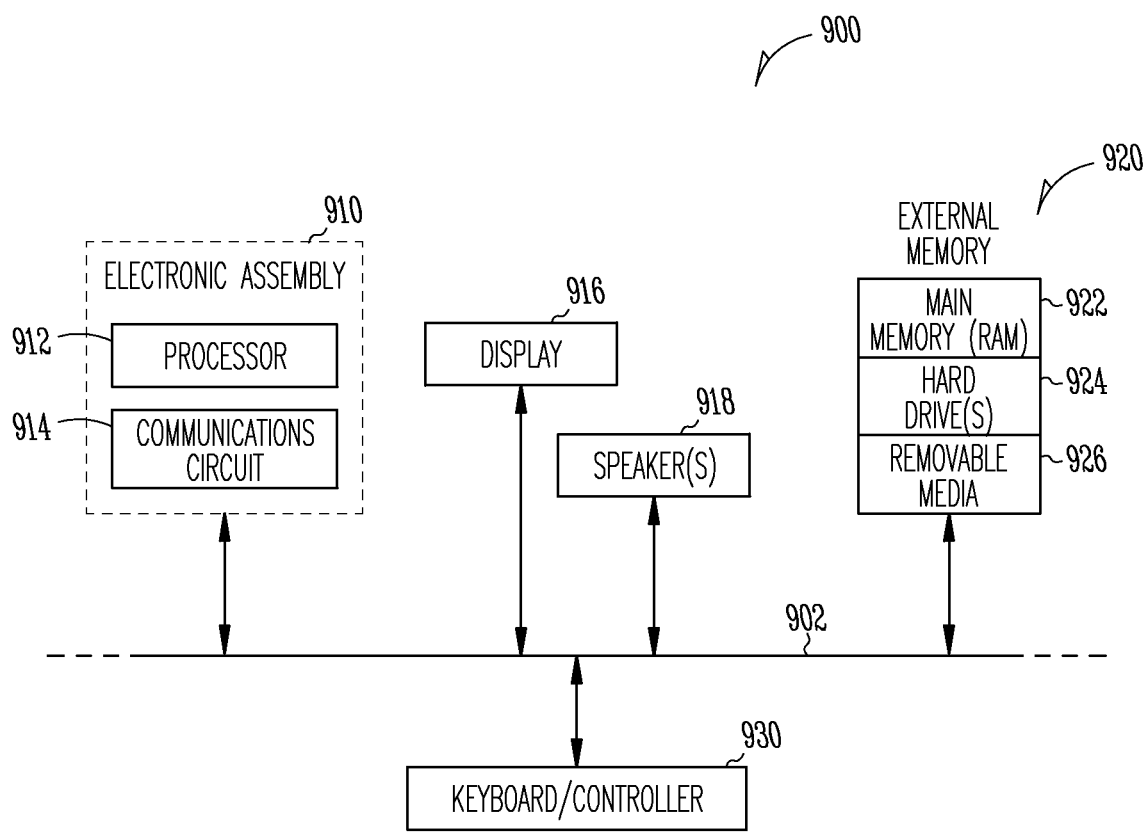
FIG. 9 is a block diagram of an electronic system in accordance with some embodiments.

An example of an electronic device using semiconductor chips and pin connection structures as described in the present disclosure is included to show an example of a higher level device application for the present invention. FIG. 9 is a block diagram of an electronic device 900 incorporating at least one pin and/or method in accordance with at least one embodiment of the invention. Electronic device 900 is merely one example of an electronic system in which embodiments of the present invention can be used. Examples of electronic devices 900 include, but are not limited to personal computers, tablet computers, mobile telephones, game devices, MP3 or other digital music players, etc. In this example, electronic device 900 comprises a data processing system that includes a system bus 902 to couple the various components of the system. System bus 902 provides communications links among the various components of the electronic device 900 and can be implemented as a single bus, as a combination of busses, or in any other suitable manner.

An electronic assembly 910 is coupled to system bus 902. The electronic assembly 910 can include any circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 910 are a custom circuit, an application-specific integrated circuit (ASIC), or the like, such as, for example, one or more circuits (such as a communications circuit 914) for use in wireless devices like mobile telephones, pagers, personal data assistants, portable computers, two-way radios, and similar electronic systems. The IC can perform any other type of function.

The electronic device 900 can also include an external memory 920, which in turn can include one or more memory elements suitable to the particular application, such as a main memory 922 in the form of random access memory (RAM), one or more hard drives 924, and/or one or more drives that handle removable media 926 such as compact disks (CD), digital video disk (DVD), and the like.

The electronic device 900 can also include a display device 916, one or more speakers 918, and a keyboard and/or controller 930, which can include a mouse, trackball, touch screen, voice-recognition device, or any other device that permits a system user to input information into and receive information from the electronic device 900.

VARIOUS NOTES & EXAMPLES

Example 1 can include subject matter (such as an apparatus, a method, a means for performing acts) that can include or use a pin grid array. The pin grid array can include a substrate, including a number of electrical connections. The pin grid array can include a matrix material forming an interface with the electrical connections on the substrate. The pin grid array can include a number of pins having pin heads embedded in the matrix, wherein one or more pins includes a pin head having a substantially convex top surface.

Example 2 can include, or can optionally be combined with the subject matter of Example 1 to include wherein the matrix material includes solder.

Example 3 can include, or can optionally be combined with the subject matter of Examples 2 to include wherein the solder includes a tin-antimony solder.

Example 4 can include, or can optionally be combined with the subject matter of any one or more of Examples 1 through 3 to include at least three legs extending at least partially away from the pin head in a direction away from a point of the pin.

Example 5 can include, or can optionally be combined with the subject matter of any one or more of Examples 1 through 4 to include wherein the substantially convex top surface includes a textured surface.

Example 6 can include, or can optionally be combined with the subject matter of any one or more of Examples 1 through 5 to include wherein the textured surface includes one or more channels.

Example 7 can include a pin grid array. The pin grid array can include a substrate, including a number of electrical connections, a matrix material forming an interface with the electrical connections on the substrate, and a number of pins having pin heads embedded in the matrix, wherein one or more pins includes a pin head having at least three legs extending at least partially away from the pin head in a direction away from a point of the pin.

Example 8 can include, or can optionally be combined with the subject matter of Example 7 to include wherein the at least three legs extend in a direction directly opposite the point of the pin.

Example 9 can include, or can optionally be combined with the subject matter of any one or more of Examples 7 through 8 to include wherein the matrix material includes solder.

Example 10 can include, or can optionally be combined with the subject matter of any one or more of Examples 7 through 9 to include wherein the solder includes a tin-antimony solder.

Example 11 can include an electronic device. The electronic device can include a substrate, including a number of top side and bottom side electrical connections, a semiconductor chip attached to the substrate using the top side electrical connections, a matrix material forming an interface with the bottom side electrical connections on the substrate, and a number of pins having pin heads embedded in the matrix, wherein one or more pins includes a pin head having a substantially convex top surface.

Example 12 can include, or can optionally be combined with the subject matter of Example 11 to include wherein the semiconductor chip includes a processor.

Example 13 can include, or can optionally be combined with the subject matter of any one or more of Examples 11 through 12 to include a memory device coupled to the semiconductor chip.

Example 14 can include, or can optionally be combined with the subject matter of any one or more of Examples 11 through 13 to include at least three legs extending at least partially away from the pin head in a direction away from a point of the pin.

Example 15 can include a method of forming a pin connection. The method can include forming a pin, including a pin head having at least three legs extending at least partially away from the pin head in a direction away from a point of the pin, placing the pin head in contact with an electrical connection on a substrate surface, and flowing solder around the pin head and in contact with the electrical connection to embed the pin head.

Example 16 can include, or can optionally be combined with the subject matter of Example 15 to include channeling gas bubbles from beneath the pin head using gaps formed by the at least three legs.

Example 17 can include, or can optionally be combined with the subject matter of any one or more of Examples 15 through 16 to include forming a substantially convex top surface on the pin head.

Example 18 can include, or can optionally be combined with the subject matter of any one or more of Examples 15 through 17 to include forming one or more channels in the substantially convex top surface.

Example 19 can include, or can optionally be combined with the subject matter of any one or more of Examples 15 through 18 to include wherein the pin grid connection is formed as part of a pin grid array.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A pin grid array, comprising;
    a substrate, including a number of electrical connections;
    a matrix material forming an interface with the electrical connections on the substrate; and
    a number of pins including pin shafts, and having pin heads embedded in the matrix, wherein one or more pins includes a pin head having a substantially convex top surface, wherein the top surface includes at least three legs extending at an angle with respect to the pin shaft between, but not including, 0 and 90 degrees.

2. The pin grid array of claim 1, wherein the matrix material includes solder.

3. The pin grid array of claim 2, wherein the solder includes a tin-antimony solder.

4. The pin grid array of claim 1, wherein the substantially convex top surface includes a textured surface.

5. The pin grid array of claim 4, wherein the textured surface includes one or more channels.

6. An electronic device, comprising:
    a substrate, including a number of top side and bottom side electrical connections;
    a semiconductor chip attached to the substrate using the top side electrical connections;
    a matrix material forming an interface with the bottom side electrical connections on the substrate; and
    a number of pins including pin shafts, and having pin heads embedded in the matrix, wherein one or more pins includes a pin head having a substantially convex top surface, wherein the top surface includes at least three legs extending at an angle with respect to the pin shaft between, but not including, 0 and 90 degrees.

7. The electronic device of claim 6, wherein the semiconductor chip includes a processor.

8. The electronic device of claim 7, further including a memory device coupled to the semiconductor chip.

\* \* \* \* \*